United States Patent [19]

Thome et al.

[11] Patent Number: 5,497,383

[45] Date of Patent: Mar. 5, 1996

[54] ERROR DETECTOR CIRCUIT FOR RECEIVER OPERATIVE TO RECEIVE DISCRETELY-ENCODED SIGNALS

[75] Inventors: Joseph F. Thome; Arvind S. Arora; Niels Vinggaard, all of Arlington Heights, Ill.

[73] Assignee: Motorola, Inc., Schaumburg, Ill.

[21] Appl. No.: 7,215

[22] Filed: Jan. 22, 1993

[51] Int. Cl.[6] .................................................. G06F 11/10
[52] U.S. Cl. ............................................ 371/43; 371/5.1
[58] Field of Search ................................. 371/43, 44, 45, 371/5.1, 5.2, 5.3, 5.4, 5.5, 38.1, 39.1, 37.4; 370/105.1

[56] References Cited

U.S. PATENT DOCUMENTS

| | | | |
|---|---|---|---|
| 4,718,081 | 1/1988 | Brenig | 379/60 |
| 4,910,794 | 3/1990 | Mahany | 370/84 |
| 4,933,765 | 6/1990 | Schiff et al. | |
| 5,073,940 | 12/1991 | Zinser et al. | |
| 5,097,507 | 3/1992 | Zinser et al. | 371/37.7 |
| 5,113,400 | 5/1992 | Gould et al. | 371/43 |
| 5,202,903 | 4/1993 | Okanoue | 375/100 |
| 5,255,343 | 10/1993 | Su | |
| 5,289,178 | 2/1994 | Schwendeman | 371/5.1 |
| 5,289,473 | 2/1994 | Nguyen | 371/5.1 |
| 5,301,197 | 4/1994 | Yamada et al. | 371/5.1 |
| 5,305,323 | 4/1994 | Lada | 371/5.1 |
| 5,309,443 | 5/1994 | Schorman | 371/5.5 |
| 5,321,705 | 6/1994 | Gould et al. | 371/43 |
| 5,323,421 | 6/1994 | LaRossa et al. | 375/10 |
| 5,331,642 | 7/1994 | Valley et al. | 371/5.1 |

OTHER PUBLICATIONS

L B Lopes On the Radio Link Performance of the Digital European Cordless Telecommunication System (1990 IEEE) pp 1013–1017.

Chia et al. Handover Criteria for City Microcellular Radio Systems (IEEE 1990 pp. 276–281).

Primary Examiner—Robert W. Beausoliel, Jr.
Assistant Examiner—Albert Decady
Attorney, Agent, or Firm—Randall S. Vaas

[57] ABSTRACT

An error detector circuit, and an associated method, for a discrete receiver. The error detector circuit indicates bad frames of binary information signals which contain distorted bits of data in numbers so great as to prevent a convolutional decoder from generating, accurately, a decoded signal. When bit errors are detected in numbers beyond a first preselected value of the signal quality of a received signal combined with the detected number of bit errors forms a signal beyond a second preselected value, a bad frame is indicated.

21 Claims, 5 Drawing Sheets

420

424

428

ERROR DETECTOR CIRCUIT FOR RECEIVER OPERATIVE TO RECEIVE DISCRETELY-ENCODED SIGNALS

BACKGROUND OF THE INVENTION

The present invention relates generally to error detector circuitry for detecting errors of discretely-encoded signals transmitted to a receiver and, more particularly, to a bad frame indicator for detecting bad frames of information signals received by a receiver constructed to receive discretely-encoded signals comprised of coded frames.

A communication system is comprised, at a minimum, of a transmitter and a receiver interconnected by a transmission channel. A communication signal is transmitted by the transmitter upon the transmission channel, thereafter to be received by the receiver. A radio communication system is a communication system in which the transmission channel comprises a radio frequency channel defined by a range of frequencies of the electromagnetic frequency spectrum. A transmitter operative in a radio communication system must convert the communication signal into a form suitable for transmission thereof upon the radio frequency channel.

Conversion of the communication signal into a form suitable for transmission thereof upon the radio frequency channel is effectuated by a process referred to as modulation. In such a process, the communication signal is impressed upon an electromagnetic wave. The electromagnetic wave is commonly referred to as a "carrier signal." The resultant signal, once modulated by the communication signal, is commonly referred to as a modulated carrier signal or, more simply, a modulated signal. The transmitter includes circuitry operative to perform such a modulation process.

Because the modulated carrier signal may be transmitted through free space over large distances, radio communication systems are widely utilized to effectuate communication between a transmitter and a remotely-positioned receiver.

The receiver of the radio communication system which receives the modulated carrier signal contains circuitry analogous to, but operative in a manner reverse with that of, the circuitry of the transmitter and is operative to perform a process referred to as demodulation.

Numerous modulated carrier signals may be simultaneously transmitted as long as the signals are transmitted upon differing radio frequency channels defined upon the electromagnetic frequency spectrum. Regulatory bodies have divided portions of the electromagnetic frequency spectrum into frequency bands and have regulated transmission of the modulated carrier signals upon various ones of the frequency bands. (Frequency bands are further divided into channels, and such channels form the radio frequency channels of a radio communication system.)

A two-way radio communication system is a radio communication system, similar to the radio communication system above-described, but which permits both transmission of a modulated carrier signal from a location and reception at such location of a modulated carrier signal. Each location of such a two-way communication system contains both a transmitter and a receiver. The transmitter and the receiver positioned at a single location typically comprise a unit referred to as a radio transceiver or, more simply, a transceiver.

A cellular, communication system is one type of two-way radio communication system in which communication is permitted with a radio transceiver positioned at any location within a geographic area encompassed by the cellular, communication system.

A cellular, communication system is created by positioning a plurality of fixed-site radio transceivers, referred to as base stations, at spaced-apart locations throughout a geographic area. The base stations are connected to a conventional, wireline, telephonic network. Associated with each base station of the plurality of base stations is a portion of the geographic area encompassed by the cellular, communication system. Such portions are referred to as cells. Each of the plurality of cells is defined by one of the base stations of the plurality of base stations, and the plurality of cells together define the coverage area of the cellular, communication system.

A radio transceiver, referred to in a cellular communication system as a cellular radiotelephone or, more simply, a cellular phone, positioned at any location within the coverage area of the cellular communication system, is able to communicate with a user of the conventional, wireline, telephonic network by way of a base station. Modulated carrier signals generated by the radiotelephone are transmitted to a base station, and modulated carrier signals generated by the base station are transmitted to the radiotelephone, thereby to effectuate two-way communication therebetween. (A signal received by a base station is then transmitted to a desired location of a conventional, wireline network by conventional telephony techniques. And, signals generated at a location of the wireline network are transmitted to a base station by conventional telephony techniques, thereafter to be transmitted to the radiotelephone by the base station.)

Increased usage of cellular, communication systems has resulted, in some instances, in the full utilization of every available transmission channel of the frequency band allocated for cellular radiotelephone communication. As a result, various ideas have been proposed to utilize more efficiently the frequency band allocated for radiotelephone communication. By more efficiently utilizing the radio frequency band utilized for radiotelephone communication, the transmission capacity of an existing, cellular, communication system may be increased.

Certain of such ideas involve converting a communication signal into discrete form prior to modulation and transmission thereof by a transmitter upon the communication channel. By converting the communication signal into such discrete form, a modulated carrier signal formed therefrom may be transmitted in short bursts, and more than one modulated signal may be transmitted sequentially upon a single transmission channel.

Converting the communication signal into discrete form is typically effectuated by an encoding technique, and apparatus which effectuates such conversion is typically referred to as a source encoder. An encoded signal generated as a result of an encoding technique is typically in the form of a discrete binary data stream. The elements (i.e., bits) of the discrete binary data stream represent various characteristics of the information signal.

A transmitter which transmits such a discretely-encoded signal typically further includes a channel encoder coupled to receive the encoded signal generated by the source encoder. The channel encoder is operative to increase the redundancy of the signal, and such redundancy facilitates accurate determination of the signal once received by a receiver.

As a radio frequency channel is not a noise-free transmission channel, noise and other transmission difficulties (e.g., intersymbol interference and Rayleigh fading) may cause a receiver to receive a signal other than that which was transmitted by the transmitter. Because an encoded signal, encoded by a channel encoder, contains redundancies, the receiver is better able to determine accurately the actual information signal transmitted by a transmitter, even when the modulated signal formed of the encoded signal has been distorted during transmission thereof. Channel decoder circuitry of the receiver is operative to remove the redundancies introduced upon the signal by the channel encoder of the transmitter.

Various block and convolutional coding and decoding techniques have been developed to facilitate accurate recreation of a communication signal. One such convolutional coding technique is a Viterbi coding technique. A transmitter may, e.g., include a Viterbi coder to perform channel encoding and a receiver may, e.g., correspondingly, include a Viterbi decoder to perform channel decoding.

When, however, distortion introduced upon the transmitted signal is so significant that the receiver receives bursts of significantly-distorted information, decoder circuitry of the receiver is unable to decode properly the received signal. Such incorrect decoding of the received signal results in the receiver recreating a signal other than the communication signal forming the modulated signal transmitted by the transmitter.

Parity bits are sometimes utilized in communication systems which transmit modulated signals formed of discretely-encoded communication signals. The values of parity bits received by a receiver are utilized to provide an indication of the amount of distortion introduced upon a signal during transmission thereof.

A transmitter operative to transmit the discretely-encoded signal oftentimes includes circuitry for introducing the parity bits into the encoded signal transmitted by the transmitter. The receiver which receives the transmitted signal including such parity bits makes a determination as to whether the parity bits of the signal received by the receiver correspond to a predetermined sequence of values (wherein such predetermined sequence of values correspond to a sequence of parity bits actually transmitted by the transmitter).

A significant amount of distortion introduced upon a signal is indicated when the receiver receives the encoded signals having the parity bits which are of values different than the predetermined sequence of values. Portions of the received signal located about the distorted parity bits are ignored by the receiver as distortion of the parity bits is indicative of distortion introduced upon other bits of that portion of the signal.

However, by random process, the parity bits received by the receiver may be of values indicative of an undistorted signal even when the signal is significantly distorted. In such instances, a receiver incorrectly determines that a distorted signal has not been distorted during transmission thereof and thereby recreates an erroneous signal. Such a method, based upon detection of distorted parity bits, of determining whether a signal received by a receiver is significantly distorted is, therefore, inadequate.

If receiver circuitry of the receiver incorrectly makes a determination as to the amount of distortion introduced upon a signal transmitted thereto, a recreated signal generated by the receiver is typically more than distorted and is, rather, more frequently, audibly noticeable as squelching.

What is needed, therefore, is a more accurate system of determining when significantly-distorted signals received by a receiver should be rejected by the receiver.

SUMMARY OF THE INVENTION

The present invention, accordingly, provides an error detector circuit for a discrete receiver.

The present invention further advantageously provides a bad frame indicator for a receiver constructed to receive a discretely-encoded signal comprised of coded frames.

The present invention still further advantageously provides a transceiver constructed to receive a discretely-encoded signal comprised of coded frames of a predetermined number of bits.

The present invention yet further advantageously provides a method for detecting when sequences of a discretely-encoded signal received by a receiver, constructed to receive discretely-encoded signals, are comprised of excessive numbers of invalid signal portions.

The present invention provides further advantages and features, the details of which will become more readily apparent when reading the detailed description of the preferred embodiments hereinbelow.

In accordance with the present invention, therefore, an error detector circuit, and associated method therefor, for a receiver operative to receive a discretely-encoded signal is disclosed. The error detector circuit is operative to determine when a sequence of the discretely-encoded signal is comprised of an excessive number of signal portions of erroneous signal values. A determination is made when signal portions of the sequence of the discretely-encoded signal received by the receiver are of erroneous signal values. An error signal of a value representative of numbers of signal portions determined to be of the erroneous signal values is generated. Signal quality levels of the sequence of the discretely-encoded signal are determined, and a signal-quality signal representative of signal quality levels so-determined is generated. The error signal and the signal-quality signal are combined theretogether to form thereby a weighted error signal. A received-signal, sequence error signal is generated when either: the weighted error signal is of a value beyond a first preselected value or the error signal is of a value beyond a second preselected value. Generation of the received-signal, sequence error signal is indicative of when the sequence of the discretely-encoded signal is comprised of the excessive number of signal portions of the erroneous signal values.

BRIEF DESCRIPTION OF THE DRAWINGS

The present invention will be better understood when read in light of the accompanying drawings in which:

FIG. 2-1 is a representation of one frame of a digitally-encoded communication signal;

FIG. 2—2 is a representation of the frame of the digitally-encoded communication signal of FIG. 2-1 encoded by a channel encoder according to a coding technique to introduce signal redundancies therein;

FIG. 2-3 is a representation of the frame of a digitally-encoded communication signal received by the receiver and decoded by a channel decoder according to a decoding technique corresponding to the coding technique used to encode the digitally-encoded communication signal to form the signal of FIG. 2—2;

FIG. 3 is a partial functional block, partial circuit diagram of the error detector circuit of a preferred embodiment of the present invention;

FIG. 4-1 is a representation of a single frame of a communication signal received by a receiver, once decoded and then re-encoded during operation of the error detection circuit of the preferred embodiment of the present invention;

FIG. 4-2 is a representation of a single frame of a signal, still in encoded form, after reception by a receiver of a preferred embodiment of the present invention which includes the error detection circuit of FIG. 3;

FIG. 4-3 is a representation of a single frame of a signal formed as a result of a comparison between the signals represented in FIGS. 4-1 and 4-2;

DETAILED DESCRIPTION OF THE PREFERRED EMBODIMENTS

Figure 1:
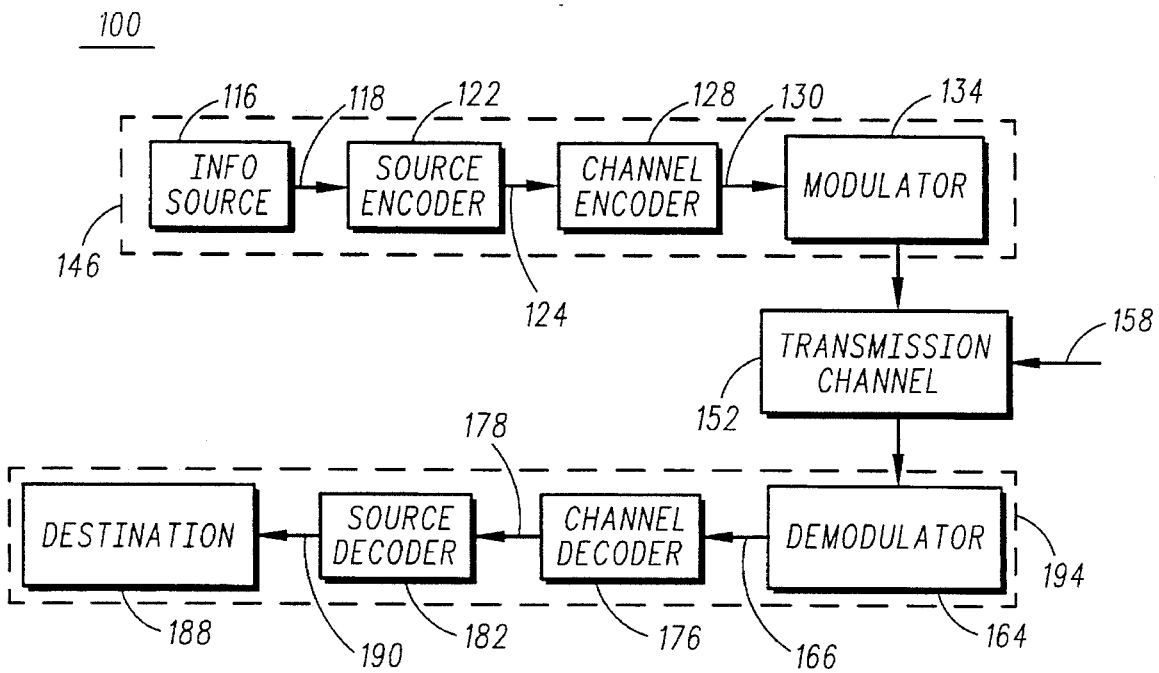
FIG. 1 is a block diagram of a communication system operable to transmit and to receive discretely-encoded communication signals.

Referring first to the block diagram of FIG. 1, a communication system, referred to generally by reference numeral 100, is shown. Communication system 100 is operable to transmit and to receive discretely-encoded communication signals.

An information source, here represented by block 116, is representative of the source of a communication signal such as, for example, a voice signal. In instances in which information source 116 is comprised of a voice signal, information source 116 includes a transducer for converting the voice signal into electrical form.

The communication signal generated by information source 116 is supplied, by way of line 118, to source encoder 122. Source encoder 122 converts the communication signal supplied thereto on line 118 into a discrete signal. Source encoder 122 may, for example, be comprised of an analog-to-digital converter which generates a digital signal at an output thereof.

The discrete signal generated by source encoder 122 is generated on line 124 which is coupled to channel encoder 128 to supply the discrete signal thereto. Channel encoder 128 encodes the discrete signal applied thereto according to a coding technique. Channel encoder 128 may, for example, comprise a block or convolutional encoder. Channel encoder 128 is operable to increase the redundancy of the discrete signal applied thereto on line 124. By increasing the redundancy of the discrete signal, transmission errors and distortion introduced upon the signal during transmission are less likely to prevent a receiver portion of communication system 100 from detecting an actual, transmitted signal.

The encoded signal generated by channel encoder 128 is applied on line 130 to modulator 134. Modulator 134 modulates the encoded communication signal applied thereto according to a modulation technique. Modulator 134 generates a modulated carrier signal formed of the encoded signal applied thereto and a carrier signal.

Information source 116, source encoder 122, channel encoder 128, and modulator 134 together comprise a transmitter, referred to generally by reference numeral 146 and indicated by the block shown in hatch which encompasses such elements.

The modulated carrier signal generated by modulator 134 of transmitter 146 is transmitted upon a transmission channel, here indicated by block 152. Because an actual, transmission channel is not an interference-free channel, interference (due, e.g., to noise, intersymbol interference and Rayleigh fading) is introduced upon the modulated carrier signal when the modulated carrier signal is transmitted thereupon. Such interference is indicated in the figure by line 158 applied to transmission channel 152.

The modulated carrier signal transmitted by transmitter 146 upon transmission channel 152 is received by a receiver. The receiver includes demodulator 164 which is operative to demodulate the modulated carrier signal, once received by the receiver. Demodulator 164 generates a demodulated signal on line 166 which is applied to channel decoder 176. Channel decoder 176 corresponds to channel encoder 128 of transmitter portion 146 and is operative in a manner reverse with that of channel encoder 128, thereby to decode the encoded signal applied thereto by demodulator 164. Channel decoder 176 generates a decoded signal, in discrete form, on line 178 which is coupled to source decoder 182.

Source decoder 182 converts the discrete signal applied thereto on line 178 into a form suitable for application to destination 188 by way of line 190. Destination 188 may, for example, comprise a speaker portion of a receiver or another such transducer for converting the electrical signal applied thereto into human perceptible form.

Demodulator 164, channel decoder 176, source decoder 182, and destination 188 together comprise the receiver, here referred to generally by reference numeral 194, indicated in the figure by the block shown in hatch.

Figures 1, 2:
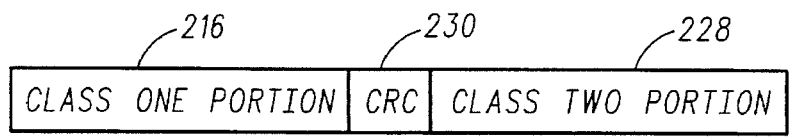
Figure 2:
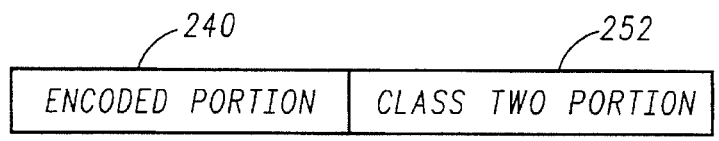

Turning now to FIG. 2-1, a single frame, referred to generally by reference numeral 210, of a digitally-encoded communication signal is represented. A frame is defined as a pre-determined number of bits, here digital bits. The digital bits, when positioned in sequential fashion, together form a coded word, alternately referred to as a code word or an encoded signal.

Frame 210 illustrated in the figure is representative of a frame defined in the Groupe Special Mobile (GSM) standard for cellular radiotelephone communications. It should, of course, be understood that the present invention is similarly applicable in any of many other communication schemes in which communication signals are discretely-encoded prior to transmission thereof.

Frame 210 of FIG. 2-1 is representative of an encoded signal generated by a source encoder, such as source encoder 122 of transmitter 146 of communication system 100 of FIG. 1. Frame 210 of FIG. 2-1 forms a code word having two portions of data bits, here class one portion 216 and class two portion 228. Portions 216 and 228 are together 260 bits in length, with portion 216 of a bit length of 182 bits and portion 228 of a bit length of 78 bits. Parity bits (alternately referred to by the phrase cyclic redundancy check, or CRC) forming parity bit portion 230 of a length of three bits is interspersed amongst portions 216 and 228. Again, it should be noted that other frame lengths and configuration are similarly possible, and that the portion lengths just-noted correspond to the GSM standard.

FIG. 2—2 is a representation of a single frame, here referred to generally by reference numeral 234, representative of frame 210 of FIG. 2-1 after a channel encoder has encoded a portion of frame 210. Class one portion 210 and parity bit portion 230 are together encoded to form encoded portion 240 of frame 234. Class two portion 252 of frame 234 corresponds to portion 228 of frame 210 and is not channel-encoded.

Portion 240 is of a length of 378 bits. (While not of significance here, prior to encoding of portions 216 and 230 of frame 210, a desired number of bits, her four bits, may be appended thereto which serve to facilitate later decoding of encoded portion 240 formed therefrom.) As portion 252 is not channel-encoded, portion 252 is of a similar bit length, namely 78 bits, as is portion 228 the 210.

Encoded portion 240 is of an increased bit length relative to bit portion 216 (together with portion 230) of frame 210 to increase thereby the redundancy of such portion, thereby to reduce the possibility that distortion of frame 234 during transmission thereof upon a transmission channel would prevent accurate recreation of the actual communication signal comprising portion 216 of frame 210. Greater, or smaller, portions of a frame may be encoded by a conventional coding technique, as desired.

Figures 2, 3:
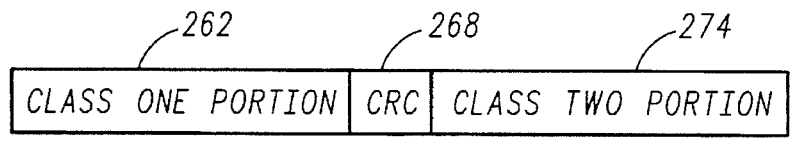
Figure 3:
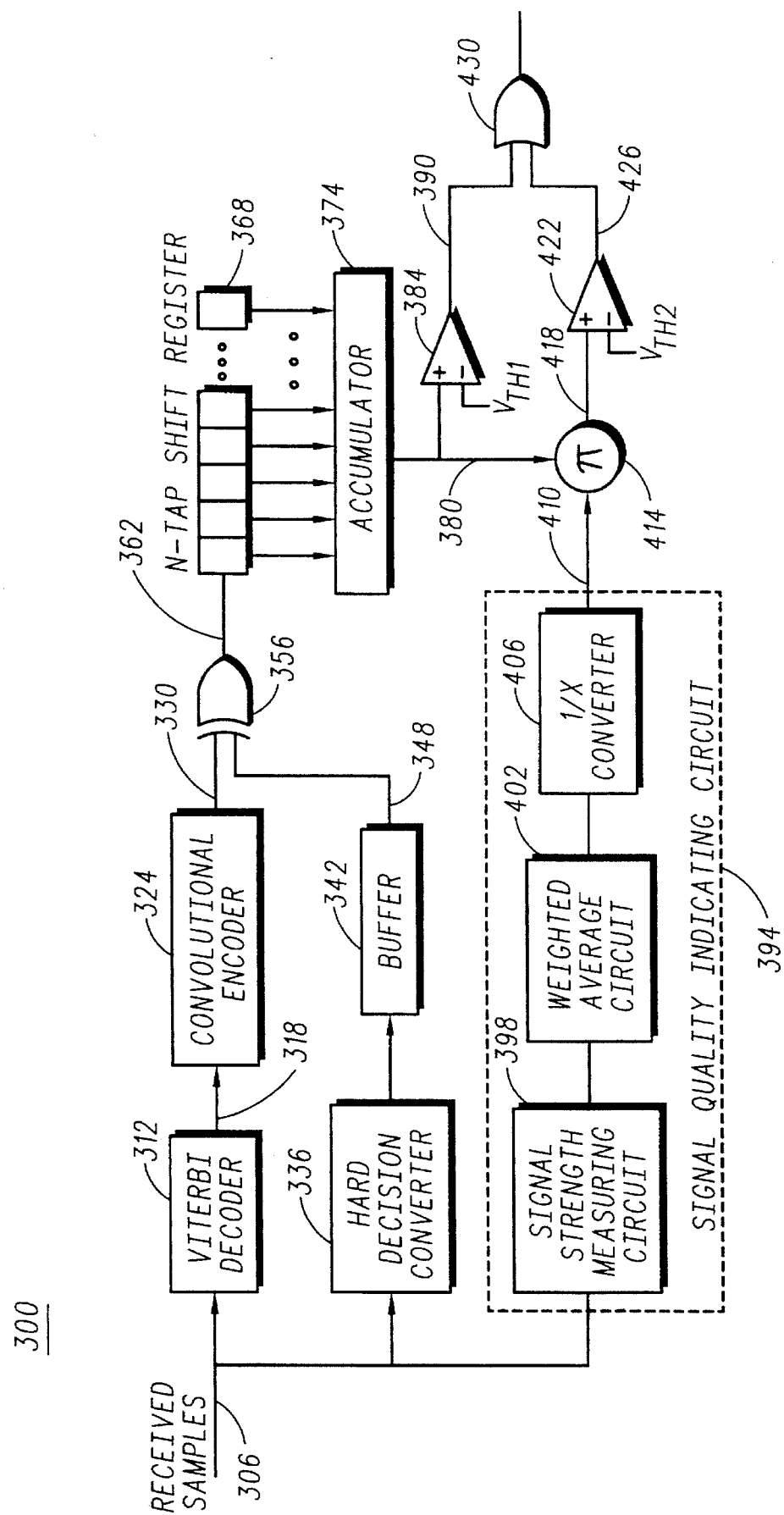

FIG. 2-3 is a representation of a frame, here referred to generally by reference numeral 256, indicative of a frame received and decoded by a decoder portion of a receiver, such as receiver portion 194 of communication system 100 of FIG. 1. Frame 256 is comprised of class one portion 262, parity bit (i.e., CRC) portion 268, and class two bit portion 274. Ideally, frame 256 of FIG. 2-3 is identical to frame 210 of FIG. 2-1. However, as described hereinabove, because the transmission channel (indicated in communication system 100 of FIG. 1 by block 152) is not noise-free and interference is introduced upon a modulated carrier signal transmitted thereupon, the signal may be distorted during transmission thereof. Distortion of the signal during transmission thereof may, therefore, cause one or many bits of portions 262, 268, and 274 to differ with corresponding portions 216, 230, and 228 of frame 210.

Use of a coding technique, here a convolutional coding technique, such as a Viterbi, convolutional coding technique, reduces the possibility that distortion of class one bit portion 240 occurring during transmission thereof would prevent accurate recreation of the actual, class one bit portion 216 of frame 210.

FIG. 3 is a partial block, partial circuit schematic diagram of the error detector circuit, referred to generally by reference numeral 300 of a preferred embodiment of the present invention. Error detector circuit 300 is operative to receive at least samples representative of a signal received by a receiver. And, in the preferred embodiment, circuit 300 receives signals representative of signal values of the signal portions of each frame comprising a modulated signal transmitted to a receiver incorporating circuit 300.

A signal representative of the signal received by a receiver is supplied on line 306 to Viterbi decoder 312. The signal supplied to Viterbi decoder 312 is utilized as a soft decision signal. Viterbi decoder 312 generates a decoded signal on line 318 which is supplied to convolutional encoder 324. Convolutional encoder 324 generates an encoded signal on line 330.

When little or no distortion is introduced upon a signal during transmission thereof to a receiver incorporating error detector circuit 300, the signal generated by convolutional encoder 324 is quite similar to, or identical to, the signal applied to Viterbi decoder 312 on line 306. However, when significant portions of the signal transmitted to the receiver incorporating error detector circuit 300 are distorted, decoder 312 is unable to recreate accurately the signal actually generated by a transmitter to be transmitted therefrom to a receiver incorporating circuit 300. Hence, significant portions of the signal generated by convolutional encoder 324 on line 330 differ with corresponding portions of the signal applied to decoder 312 on line 306.

Line 306 is also coupled to hard decision converter 336 whereat the signal applied on line 306, utilized as a soft decision signal, is converted into a series of digital pulses which are stored in buffer 342. Buffer 342 is of a capacity at least as great as the length of a transmitted frame, such as frame 234 of FIG. 2—2. Output line 348 interconnects an output of buffer 342 to an input of logical gate 356, here a logical exclusive-OR gate. The re-encoded signal generated on line 330 by convolutional encoder 324 is supplied to a second input of gate 356.

Gate 356 is operative to determine when the re-encoded signal generated by encoder 324 on line 330 differs from the signal supplied to circuit 300 on line 306. Gate 356 generates a comparison signal on line 362, and the comparison signal is supplied, in serial fashion, to shift register 368. Each bit of the comparison signal generated on line 362 and supplied to shift register 368 is supplied to accumulator 374.

Accumulator 374 is operative to determine the number of signal portions, here bits, which are of a logical one value (when gate 356 comprises the logical exclusive-OR gate). When gate 356 generates the comparison signal of a logical one value, the signals applied thereto on lines 330 and 348 are of dissimilar values—i.e., the corresponding bits of the signals generated on such two lines are of dissimilar values. Accumulator 374 is thereby operative to count the number of bit dissimilarities between the signals generated on lines 330 and 348. Accumulator 374 generates a signal on line 380 indicative of such count of bit dissimilarities.

Line 380 is coupled to an input of comparator 384, and a first threshold voltage is applied to a second input of comparator 384. When the value of the signal generated by accumulator 374 on line 380 is greater than the threshold voltage, comparator 384 generates a signal of a high value on line 390. Otherwise, comparator 384 generates a signal of a low value, or no signal, on line 390.

Line 306 is further coupled to signal quality indicating circuit 394 which, in the preferred embodiment includes a signal strength measuring circuit 398, weighted averaging circuit 402, and reciprocal inverter circuit 406, each connected in series. Circuits 398, 402, and 406 are operative, respectively, to measure the signal strength of the signal generated on line 306, to form a weighted average of such measured signal strength in a conventional manner, and to form a reciprocal of such weighted average. The signal quality indicating circuit generates a signal-quality signal representative of the signal quality of the signal applied thereto. And, more particularly, in the preferred embodiment, the signal-quality signal is of a value corresponding to a reciprocal of a weighted average of a measured signal strength of the signal applied thereto.

The signal-quality signal is generated on line 410 which is coupled to an input of multiplier 414. Line 380 is coupled to another input of multiplier 414 to supply the signal generated by accumulator 374 thereto. Multiplier 414 is operative to multiply the signals applied thereto on lines 380 and 410. As the signal generated by accumulator 374 on line 380 is representative of bit dissimilarities between the signals generated on lines 330 and 348 and, hence, is representative of bit "errors", the product formed by multiplier 414 forms a weighted error signal. The weighted error signal formed by multiplier 414 is generated on line 418 which is coupled to an input of comparator 422. A second threshold voltage is applied to a second input of comparator 422.

Comparator 422 is operative to generate an output signal on line 426 of a high logic level when the weighted error signal generated on line 418 is of a value greater than the threshold voltage level. Otherwise, comparator 422 generates a signal on line 426 of a low logic level.

Lines 390 and 426 coupled to outputs of comparators 384 and 422, respectively, are applied to inputs of gate 430, here a logical-OR gate. Gate 430 is operative to generate an output signal, here referred to as a received-signal, sequence error signal whenever a signal of a high logical value is generated on lines 390 or 426. Such signal generated by error detector circuit 300 is utilized to provide an indication to a receiver that a received frame of a communication signal is to severely distorted (i.e., includes too many bit errors) to permit adequate recreation thereof.

It should be noted that, while circuit 300 is at least partially represented by electrical circuit components in FIG. 3, in the preferred embodiment, circuit 300 is implemented by algorithms executable by processor circuitry. Hardware implementation of circuit 300 is, of course, possible.

Figures 1, 4:
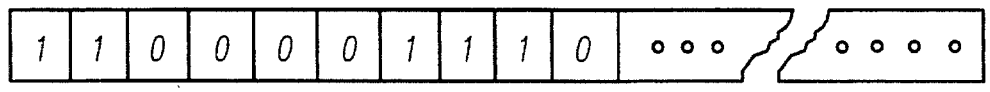
Figures 2, 4:
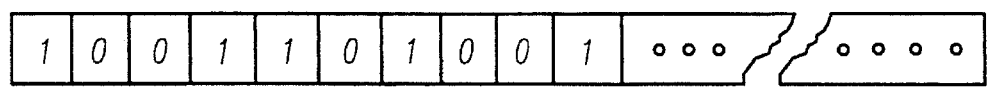
Figures 3, 4:
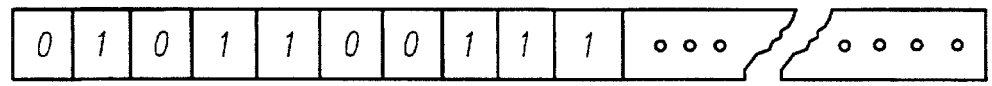

FIG. 4-1 is a representation of a single frame, here referred to generally by reference numeral 420, of a typical communication signal received and re-encoded by convolutional encoder 324 of error detector 300. For purposes of illustration, values of several of the bits of which the frame is comprised are indicated in the figure. Frame 420 corresponds to the re-encoded signal supplied on line 330 to gate 356.

FIG. 4-2 is a representation, similar to that of the representation of FIG. 4-1, but representative of a single frame, here referred to generally by reference numeral 424, of an encoded signal received by a receiver and supplied to gate 356 of circuit 300 on line 348. Similar to frame 420 of FIG. 4-1, for purposes of illustration, values of selected ones of the bits of which frame 424 is comprised are indicated in the figure. It is to be noted that the values assigned to the bit locations are solely for purposes of illustration.

FIG. 4-3 is a representation of a single frame, here referred to generally by reference numeral 428, of the comparison signal generated on line 362 by gate 356 of error detector circuit 300 of FIG. 3. The comparison signal is of a high logical value when comparison of corresponding bits of the signals generated on lines 330 and 348, and represented by frames 420 and 424 of FIGS. 4-1 and 4-2, respectively, are of dissimilar values. Upon examination of frame 428 of FIG. 4-3, it may be discerned that when a bit of frame 420 is of the same value as that of a corresponding bit of frame 424, the corresponding bit of frame 428 is of a value of a logical zero. When the value of a bit of frame 420 is dissimilar with that of a corresponding bit of frame 424, the corresponding bit of frame 428 is of a value of a logical 1.

The comparison signal generated on line 362 of circuit 300, and represented by frame 428 of FIG. 4-3, is shifted into shift register 368, and accumulator 374 is operative to count the number of bits of the signal which are of a logical one value. Shift register 368 is of a length permitting the bits of an entire frame of a comparison signal to be stored therewithin, thereat to permit accumulator 374 to count the number of detected bit dissimilarities over an entire frame of data. The signal generated by accumulator 374 on line 380 is representative of the number of bit dissimilarities over the entire frame of data.

Comparator 384 of circuit 300 is operative to generate a signal on line 390 when the value of the signal generated on line 380 (i.e., the number of detected bit dissimilarities over a frame of data) is beyond a preselected value.

Comparator 422, which receives the weighted error signal on line 418 (which is the signal generated by accumulator 374 on line 380 combined with the signal-quality signal generated on line 410) is operative to generate a signal on line 426 when the weighted error signal is beyond a preselected value. As the signal quality is, at least in part, determinative of whether a signal including distortion may be accurately decoded, the weighted error signal generated on line 418 provides an indication of the signal quality level together with the number of detected bit errors. (A signal of high signal quality having a certain number of bit errors may still be decoded accurately while a signal having the same number of bit errors but of a lower signal quality may not be accurately decoded.)

Figure 5:
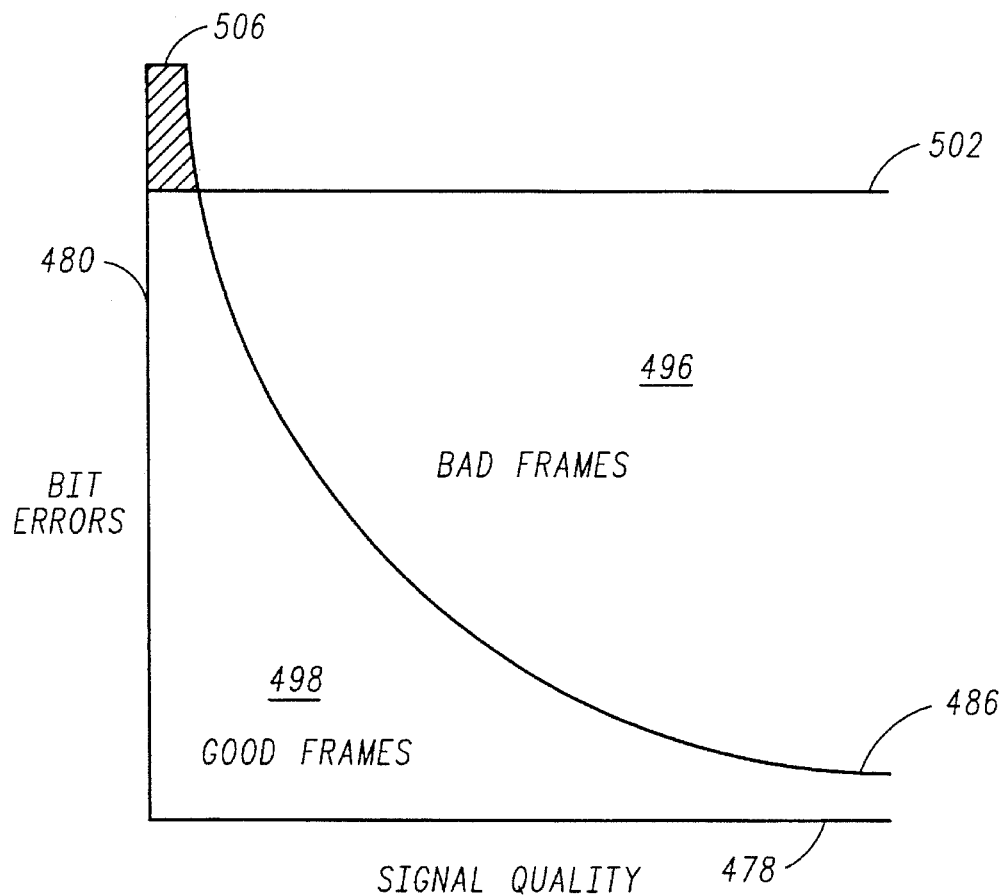
FIG. 5 is a plot of a curve formed by a combination of a signal representative of the number of bit errors in a frame of a communication signal transmitted to a receiver, and determined during operation of the error detector circuit of FIG. 3 and an inverse of a signal-quality signal, also formed during operation of the error detector circuit of FIG. 3.

Turning next to the graphical representation of FIG. 5, the weighted error signal generated on line 418 of detector 300 of FIG. 3 is graphically shown. The weighted error signal is formed of the product of values of the signal-quality signal, the reciprocal of which is plotted along abscissa axis 478, and a detected number of bit errors, here plotted along ordinate axis 480. Curve 486 is formed of the product of the value of the signal-quality signal and the number of detected bit errors represented by the error signal generated on line 380 of detector 300. Values along abscissa axis 478 correspond to values of the signal-quality signal generated on line 410, the values along ordinate axis 480 correspond to the values of the error signal generated on line 380, and curve 486 corresponds to the weighted error signal generated on line 418 of detector 300.

The area formed to the fight of curve 486, here denoted by reference numeral 496, represents times in which the weighted error signal is of a greater value than the threshold voltage applied to comparator 422 to cause a signal to be generated on line 426 of detector 300 indicative of a bad frame of data. The area to the left of curve 486, here denoted by reference numeral 498, is indicative of times in which the weighted error signal is of a value less than the threshold value applied to 422 and is indicative of a good frame of data. In most instances, such single comparison is adequate to determine whether a frame of data contains too many bit errors, given the signal quality of the received signal, to permit adequate recreation of a transmitted signal.

However, when the number of bit errors is very significant (i.e., when the error signal generated on line 380 is of a very large value) a receiver cannot accurately recreate a transmitted signal no matter how good the signal quality of the received signal is (as represented by the signal-quality signal generated on line 410). In such instances, the signal generated by comparator 384 on line 390 is utilized to provide an indication that the received frame of data includes too many bit errors to permit accurate recreation of the transmitted signal.

Line 502 is representative of a preselected number of bit errors (i.e., the value of the error signal generated by accumulator 374 on line 380 of a preselected value). Comparator 384 generates a signal on line 390 when the number of bit errors is above such preselected value (i.e., the area above line 502); otherwise comparator 384 does not generate a signal on line 390 (i.e., the area beneath line 502).

While substantial portions of the area above line 502 and area 496 above curve 486 overlap, a shaded portion, area 506, is above line 502 but is beneath curve 486. Hence, utilization of the signal generated by comparator 384 and 390 provides an indication of a bad frame of data in some instances in which the signal generated by comparator 422 on line 426 would indicate a good frame of data. Accordingly, by application of the signals generated on lines 390 and 426 to logical-OR gate 430, an indication is generated on line 434 to provide an indication that a frame of data contains excessive numbers of bit errors, even when the signal quality level is relatively high. By altering the values of the threshold voltages applied to comparators 422 and 384, the location of curve 486 and 502 may be altered, as desired.

Figure 6:
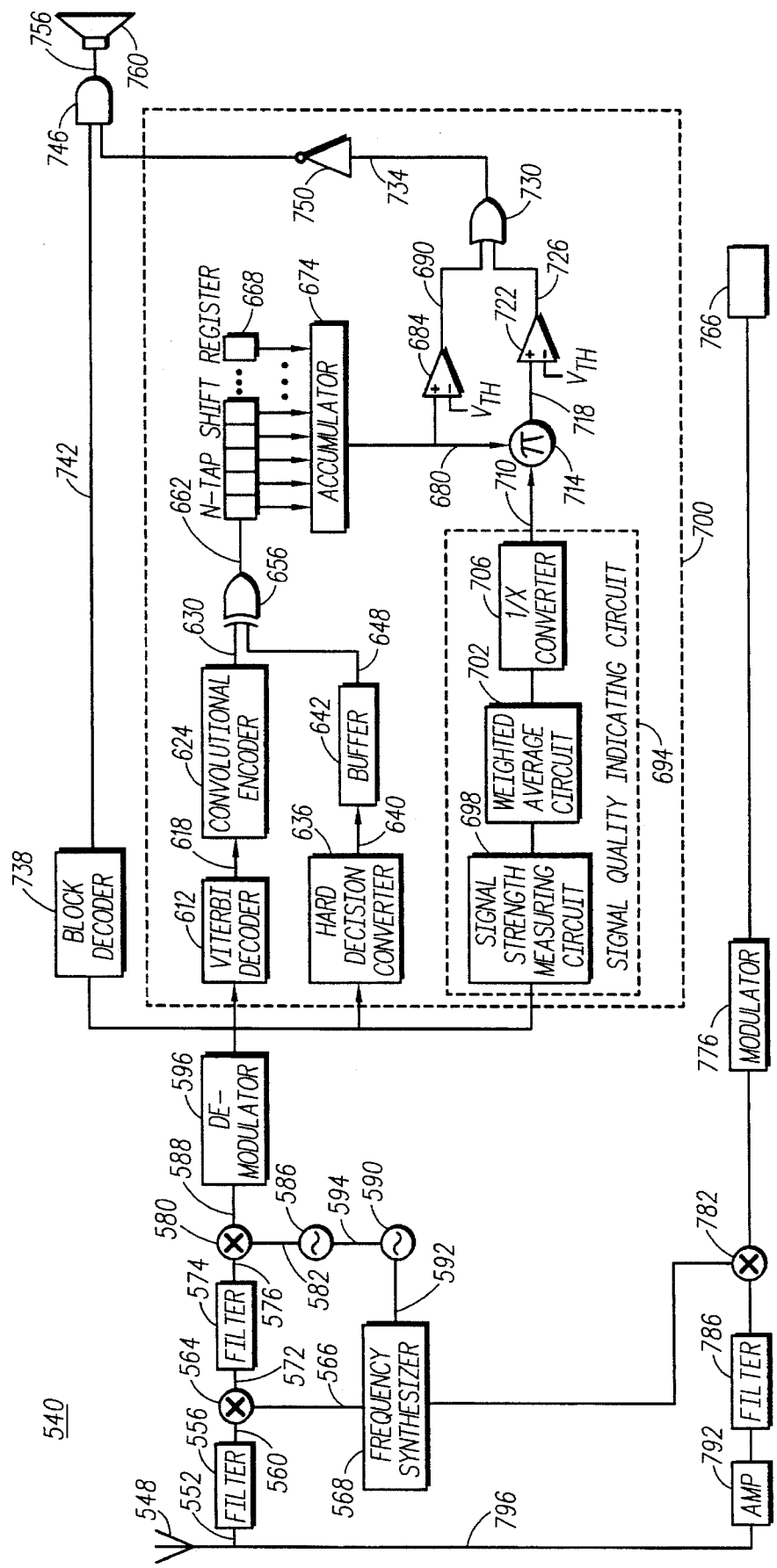
FIG. 6 is a partial block, partial circuit schematic diagram of a radiotelephone of a preferred embodiment of the present invention which includes the error detector of FIG. 3 as a portion thereof.

Turning next to the partial block, partial electrical schematic diagram of FIG. 6, a radio transceiver, such as a cellular radiotelephone, here referred to generally by reference numeral 540, is shown. Transceiver 540 incorporates the error detector circuit 300 of FIG. 3 as a portion thereof. A signal transmitted by a transmitter over a transmission channel is received by antenna 548, and an electrical signal indicative of the received signal is generated on line 552 and applied to filter 556. Filter 556 generates a filtered signal on line 560 which is applied to a first input of mixer 564. An oscillating signal generated on line 566 by frequency synthesizer 568 is applied to a second input of mixer 564. Mixer 564 is operative to generate a first down-mixed signal on line 572 which is coupled to filter 574 to apply the down-converted signal thereto.

Filter 574 generates a filtered signal on line 576 which is applied to an input of second mixer 580. An oscillating signal generated on line 582 by oscillator 586 is applied to a second input of mixer 580. Second mixer 580 is operative to generate a second down-converted signal on line 588.

Frequency synthesizer 568 and oscillator 586 are maintained in a relative frequency relationship with reference oscillator 590 by way of lines 592 and 594, respectively.

The second down-converted signal generated on line 588 by second mixer 580 is applied to demodulator 596. Demodulator 596 demodulates the signal applied thereto and generates a demodulated signal on line 606 which is applied to Viterbi decoder 612. Viterbi decoder is operative to decode the signal applied thereto and to generate a decoded signal on line 618. Line 618 is coupled to convolutional encoder 624 which is operative to encode the signal applied thereto and generate an encoded signal indicative thereof on line 630.

The demodulated signal generated by demodulator 596 on line 606 is also applied to hard decision converter 636 which is operative to convert the signal thereto into a hard decision signal which is generated on line 640 and stored in buffer 642. The hard decision signal stored in buffer 642 is generated on line 648 which is coupled to an input of logical exclusive-OR gate 656. The encoded signal generated on line 630 is also applied to an input of gate 656. Gate 656 is operative to generate a comparison signal of values corresponding to comparisons between the signals generated on lines 630 and 648. The comparison signal generated on line 662 is applied to shift register 668. Accumulator 674 is operative to count the number of bits of logical one values stored in shift register 668 and to generate an error signal on line 680 indicative of such counted number of bits. Line 680 is coupled to a first input of comparator 684 and a threshold voltage is applied to a second input of the comparator. Comparator 684 generates a signal on line 690 when the error signal applied thereto on line 680 exceeds the threshold voltage level.

The signal generated by demodulator 596 on line 606 is further applied to signal quality indicating circuit 694 which is operative to determine the signal quality of the signal and to generate a signal-quality signal on line 710. Line 710 is coupled to an input of multiplier 714, and the error signal generated on line 680 is applied to another input of multiplier 714. Multiplier 714 forms the product of the signals applied thereto and generates a weighted error signal on line 718 which is applied to an input of comparator 722. A threshold voltage is applied to a second input of comparator 722. Comparator 722 generates a signal on line 726 when the weighted error signal generated on line 718 exceeds the threshold voltage level.

Lines 690 and 726 are applied to inputs of logical-OR gate 730. Gate 730 generates a received-signal, sequence error signal on line 734 when a signal is generated on either line 690 or 726 (or both lines 690 and 726). Elements 612-730 correspond to corresponding elements 312-430 of error detector circuit 300 of FIG. 3. Hence, error detector circuit 700 comprised of the elements shown within the block shown in hatch in the figure, comprises a portion of transceiver 540 and is operative to provide an indication on line 734 during times in which a frame of a signal received by transceiver 540 is so significantly distorted that the receiver portion of transceiver 540 is unable to recreate the actual, transmitted signal transmitted thereto.

The decoded signal generated by Viterbi decoder 612 on line 618 is further supplied to block decoder 738. Block decoder 738 is operative in a manner analogous to source decoder 82 of communication system 100 of FIG. 1 to decode the signal applied thereto and to generate a decoded signal on line 742 to an input of logical-AND gate 746. The received-signal, sequence error signal generated on line 734 is inverted by inverter 750 and applied to a second input of gate 746. Because of inverter 750, gate 746 generates the signal applied thereto on line 742 on output line 756 during only those times in which no received-signal, sequence error signal is generated by gate 730. Line 756 is coupled to a transducer, such as speaker 760.

Transceiver 540 further includes a transmitter portion, here shown to be comprised of a transducer 766, such as a microphone, which generates an electrical signal which is applied to modulator 776. Modulator 776 generates a signal which is applied to an input of mixer 782. Mixer 782 also receives an oscillating signal generated by frequency synthesizer 568 and generates an up-mixed signal which is applied to filter 786. Filter 786 generates a filtered signal which is amplified by amplifier 792 and which, in turn, is applied to antenna 552 by way of line 796 to permit transmission therefrom.

Figure 7:
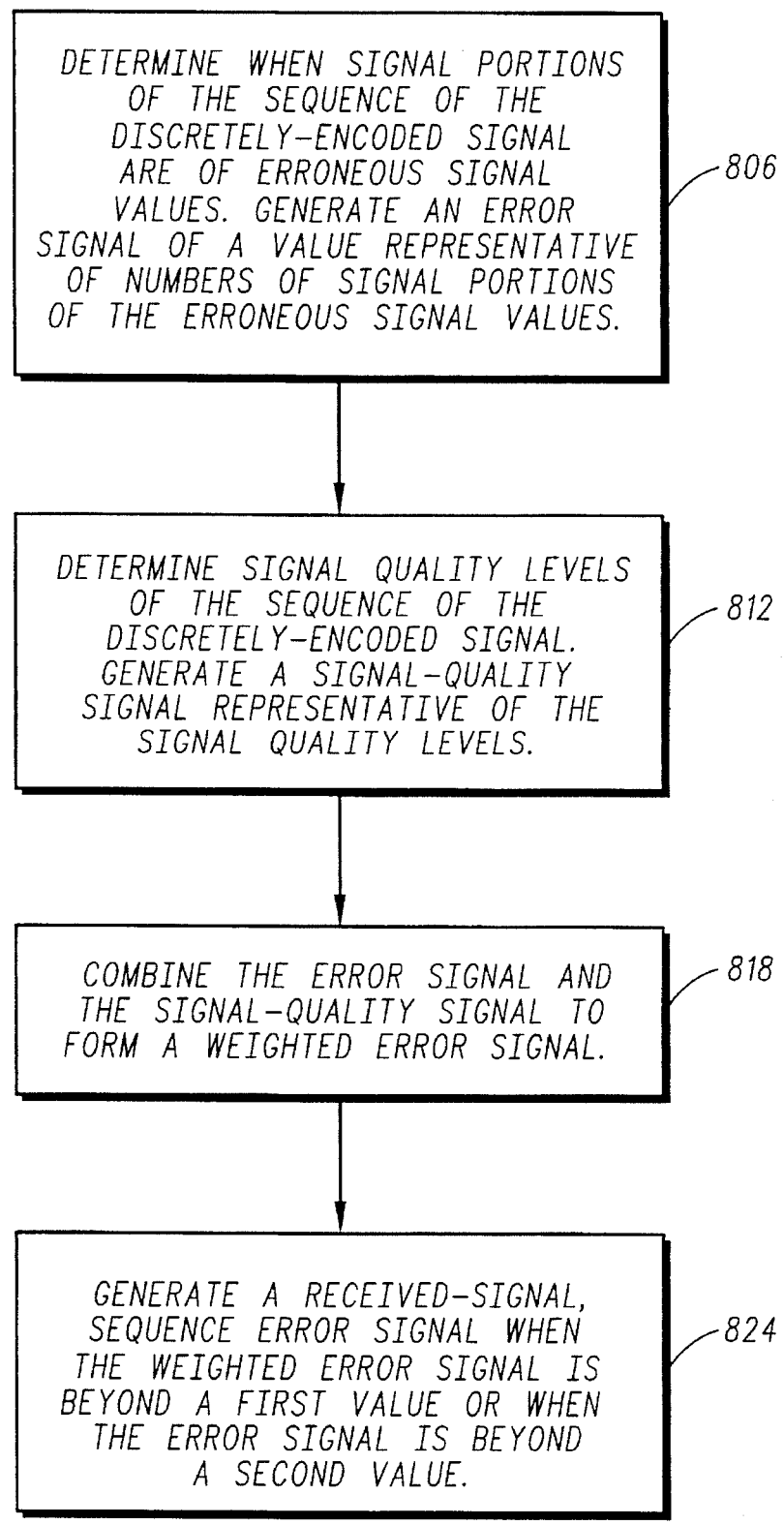
FIG. 7 is a flow diagram listing the method steps of the method of a preferred embodiment of the present invention.

Turning finally to the logical flow diagram of FIG. 7, the method steps of the method of the preferred embodiment of the present invention, referred to generally by reference numeral 800, are listed. First, and indicated in block 806, a determination is made when signal portions of the sequence of the discretely-encoded signal received by a receiver are of erroneous signal values. An error signal indicative thereof is generated. Next, and as indicated by block 812, signal quality levels of the sequence of the discretely-encoded signal are determined. A signal-quality signal representative of such signal quality levels is also generated. Next, and as indicated by block 818, the error signal and the signal-quality signal are combined theretogether to form thereby a weighted error signal. Finally, and as indicated by block 824, a receive-signal, sequence error signal is generated when either the weighted error signal is of a value beyond a first preselected value or the error signal is of a value beyond a second preselected value.

While the present invention has been described in connection with the preferred embodiments shown in the various figures, it is to be understood that other similar embodiments may be used and modifications and additions may be made to the described embodiments for performing the same function of the present invention without deviating therefrom. Therefore, the present invention should not be limited to any single embodiment, but rather construed in breadth and scope in accordance with the recitation of the appended claims.

What is claimed is:

1. An error detector circuit for a receiver operative to receive a discretely-encoded signal at an input thereof, the error detector circuit operative to determine when a sequence of the discretely-encoded signal is comprised of an excessive number of signal portions of erroneous signal values, the error detector circuit comprising:

a first detector coupled to the input to determine when signal portions of the sequence of the discretely-encoded signal received by the receiver are of erroneous signal values and to generate a first error signal of a value representative of the number of signal portions determined to be of the erroneous signal values;

a second detector coupled to the input to determine the signal quality levels of the sequence of the discretely-encoded signal and to generate a signal-quality signal representative of signal quality levels determined thereat;

a combiner coupled to the first and second detectors to combine the first error signal and the signal-quality signal to form thereby a weighted error signal;

a signal generator coupled to the first detector and to the combiner to generate a received-signal sequence error signal when either:

the weighted error signal is of a value beyond a first preselected value; or the first error signal is of a value beyond a second preselected value;

wherein generation of the received-signal sequence error signal is indicative of when the sequence of the discretely-encoded signal is comprised of the excessive number of signal portions of the erroneous signal values.

2. The error detector circuit of claim 1 wherein the first detector comprises:

a decision circuit to generate a soft decision signal representative of the discretely-encoded signal received by the receiver;

a decoder coupled to the decision circuit to decode the soft-decision signal representative of the discretely-encoded signal generated by the first decision circuit and to generate a decoded signal responsive to values of the soft decision signal;

a coder coupled to the decoder to re-encode the decoded signal generated by the decoder;

a hard decision converter coupled to the decision circuit to convert the soft decision signal representative of the discretely-encoded signal received by the receiver into a hard decision signal; and a comparator coupled to the coder and to the hard decision converter to compare the encoded signal generated by the coder with the hard decision signal.

3. The error detector circuit of claim 2 wherein the first error signal generated by the first detector is of a level proportional to a magnitude of numbers of times in which values of signal portions of a sequence of the hard decision signal differ with values of a corresponding sequence of the discrete receiver-encoded signal.

4. The error detector circuit of claim 2 wherein the decoder comprises a Viterbi decoder.

5. The error detector circuit of claim 4 wherein the Viterbi decoder decodes the soft decision signal and generates a decoded signal sequence therefrom.

6. The error detector circuit of claim 2 wherein the coder comprises a convolutional encoder.

7. The error detector circuit of claim 6 wherein the convolutional encoder encodes decoded signal sequences and generates discrete receiver-encoded signal sequences therefrom.

8. The error detector circuit of claim 2 further including a receiver comprising a demodulator, wherein the soft decision signal is comprised of a demodulated signal demodulated by the receiver.

9. The error detector circuit of claim 2 further comprising a buffer to store a sequence of signal portions of the hard decision signal formed by the hard decision converter.

10. The error detector circuit of claim 2 wherein the comparator comprises an exclusive-or logic circuit.

11. The error detector circuit of claim 1 wherein the second detector comprises a measuring circuit to measure signal magnitude levels of at least one signal portion of a signal representative of the sequence of the discretely-encoded signal received by the receiver.

12. The error detector circuit of claim 11 wherein the second detector further comprises means for calculating weighted-average signal magnitude levels formed of a weighted average of at least two signal portions of the signal representative of the sequence of the discretely-encoded signal received by the receiver.

13. The error detector circuit of claim 12 wherein the signal-quality signal generated by the second detector is of a value proportional to reciprocal value levels of the weighted-average signal magnitude levels calculated by the means for calculating.

14. The error detector circuit of claim 1 wherein the weighted error signal formed by the combiner is formed by multiplying values of the first error signal and the signal-quality signal theretogether.

15. The error detector circuit of claim 1 wherein the signal generator comprises a first comparator having a first input and a second input wherein the weighted error signal is applied to the first input of the first comparator and a first threshold signal of a value corresponding to the first preselected value is applied to the second input of the first comparator, the first comparator being operative to generate a first comparison signal responsive to times in which the weighted error signal is of a value greater than the first threshold signal.

16. The error detector circuit of claim 15 wherein the signal generator further comprises a second comparator having a first input and a second input wherein the weighted error signal is applied to the first input of the second comparator and a second threshold signal of a value corresponding to the second preselected value is applied to the second input of the second comparator, the second comparator being operative to generate a second comparison signal responsive to times in which the weighted error signal is of a value greater than the second threshold signal.

17. The error detector circuit of claim 16 wherein signal generator further comprises a logical-OR gate having a first input and a second input wherein the first comparison signal is applied to the first input of the logical-OR gate and wherein the second comparison signal is applied to the second input of the logical-OR gate, the logical-OR gate being operative to generate an output signal forming the received-signal sequence error signal when at least one of the first comparison signal and the second comparison signal is applied thereto.

18. A bad frame indicator for a receiver constructed to receive a discretely-encoded signal comprised of coded frames of a pre-determined number of bits, the bad frame indicator operative to detect when the receiver receives an invalid frame, the bad frame indicator comprising:

means for determining when signal portions of a coded frame received by the receiver are of erroneous signal values and for generating a first error signal of a value representative of the number of signal portions of the coded frame determined to be of the erroneous signal values;

means for determining signal quality levels of the coded frame and for generating a signal-quality signal representative of signal quality levels determined thereat and for generating a weighted error signal as a function of the signal quality level;

means for generating a received-signal sequence error signal when the weighted error signal is of a value beyond a first preselected value and when the first error signal is of a value beyond a second preselected value wherein generation of the received-signal sequence error signal is indicative of when the receiver receives an invalid frame.

19. A radio receiver operative to receive a discretely-encoded signal, the radio receiver comprising:

a demodulator for inputting a sequence of discretely encoded received signals:

a first detector coupled to the demodulator to determine when signal portions of the sequence of the discretely-encoded signal received by the receiver are of erroneous signal values and for generating a first error signal of a value representative of the number of signal portions determined to be of the erroneous signal values;

a second detector coupled to the demodulator and to the first detector to determine signal quality levels of the sequence of the discretely-encoded signal, to determine a signal-quality signal representative of signal quality levels determined thereat to generate a weighted error signal as a function of the first error signal and the signal-quality signal;

a first generator coupled to the second detector to generate a received-signal sequence error signal when the weighted error signal is of a value beyond a first preselected value a second generator coupled to the first detector to generate a received signal sequence error signal when the the first error signal is of a value beyond a second preselected value;

wherein generation of a received-signal sequence error signal is indicative of when the sequence of the discretely-encoded signal is comprised of the excessive number of signal portions of the erroneous signal values.

20. A method for determining when sequences of a discretely-encoded signal received by a receiver are comprised of an excessive number of signal portions of erroneous signal values, the method comprising the steps of:

determining when signal portions of the sequence of the discretely-encoded signal received by the receiver are of erroneous signal values and for generating a first error signal of a value representative of the number of signal portions determined to be of the erroneous signal values;

determining signal quality levels of the sequence of the discretely-encoded signal and for generating a signal-quality signal representative of signal quality levels determined thereat;

combining the first error signal and the signal-quality signal theretogether to form thereby a weighted error signal;

generating a received-signal sequence error signal when the weighted error signal is of a value beyond a first preselected value; and generating a received signal sequence error signal when the first error signal is of a value beyond a second preselected value.

21. The radio receiver as defined in claim 19, wherein the second preselected value is not equal to the first preselected value.

* * * * *